United States Patent
Khoshnevisan et al.

(10) Patent No.: US 11,387,932 B2
(45) Date of Patent: Jul. 12, 2022

(54) SYSTEMATIC BIT PRIORITY MAPPING INTERLEAVING FOR LAYERS WITH DIFFERENT MODULATION ORDERS

(71) Applicant: QUALCOMM Incorporated, San Diego, CA (US)

(72) Inventors: Mostafa Khoshnevisan, San Diego, CA (US); Jing Sun, San Diego, CA (US); Xiaoxia Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 356 days.

(21) Appl. No.: 16/575,033

(22) Filed: Sep. 18, 2019

(65) Prior Publication Data

US 2020/0127758 A1 Apr. 23, 2020

Related U.S. Application Data

(60) Provisional application No. 62/748,088, filed on Oct. 19, 2018.

(51) Int. Cl.
*H04L 1/00* (2006.01)
*H04B 17/336* (2015.01)
*H04L 5/00* (2006.01)

(52) U.S. Cl.
CPC ......... *H04L 1/0003* (2013.01); *H04B 17/336* (2015.01); *H04L 1/0071* (2013.01); *H04L 5/0046* (2013.01)

(58) Field of Classification Search
CPC ... H04L 1/0003; H04L 1/0071; H04L 5/0046; H04L 5/001; H04L 27/2602; H04L 5/0023; H04L 27/3488; H04L 2001/0098; H04L 1/0045; H04L 5/0007; H04L 5/0057; H04L 1/0041; H04L 5/0048; H04L 5/006; H04L 27/183; H04B 17/336; H04B 17/318; H03M 13/356; H03M 13/25; H03M 13/2707
(Continued)

(56) References Cited

U.S. PATENT DOCUMENTS

2011/0299383 A1* 12/2011 Ko ............ H04B 7/0613 370/210
2019/0044544 A1* 2/2019 Liao .............. H03M 13/2778

FOREIGN PATENT DOCUMENTS

EP 1971096 A2 9/2008

OTHER PUBLICATIONS

International Search Report and Written Opinion—PCT/US2019/051919—ISA/EPO—dated Dec. 12, 2019.
(Continued)

*Primary Examiner* — Fitwi Y Hailegiorgis
(74) *Attorney, Agent, or Firm* — Harrity & Harrity, LLP \ Qualcomm

(57) ABSTRACT

Various aspects of the present disclosure generally relate to wireless communication. In some aspects, a transmitter may determine a first modulation order for a first layer of a communication and a second modulation order for a second layer of the communication, wherein the first modulation order and the second modulation order are different; interleave bits for one or more of the first layer or the second layer based at least in part on the first modulation order and the second modulation order; and transmit the interleaved bits via the one or more of the first layer or the second layer. Numerous other aspects are provided.

30 Claims, 13 Drawing Sheets

(58) Field of Classification Search
USPC .......................................................... 370/329
See application file for complete search history.

(56) References Cited

OTHER PUBLICATIONS

LG Electronics: "LDPC Coded Bits Interleaver and Symbol Mapping for HARQ", 3GPP Draft; R1-1801001 LDPC Coded Bits Interleaver And Symbol Mapping For HARQ, 3rd Generation Partnership Project (3GPP), Mobile Competence Centre ; 650, Route Des Lucioles ; F-06921 Sophia-Antipolis, vol. RAN WG1, No. Vancouver, Canada; Jan. 22, 2018-Jan. 26, 2018, Jan. 17, 2018 (Jan. 17, 2018), XP051385228, 8 Pages, Retrieved from the Internet: URL:http://www.3gpp.org/ftp/tsg%5Fran/WG1%5FRL1/TSGR1%5FAH/NR%5FAH%5F1801/Docs/ [retrieved on Jan. 17, 2018], section 2.

* cited by examiner

SYSTEMATIC BIT PRIORITY MAPPING INTERLEAVING FOR LAYERS WITH DIFFERENT MODULATION ORDERS

CROSS-REFERENCE TO RELATED APPLICATION

This application claims priority to U.S. Provisional Patent Application No. 62/748,088, filed on Oct. 19, 2018, entitled "SYSTEMATIC BIT PRIORITY MAPPING INTERLEAVING FOR LAYERS WITH DIFFERENT MODULATION ORDERS," which is hereby expressly incorporated by reference herein.

FIELD OF THE DISCLOSURE

Aspects of the present disclosure generally relate to wireless communication and to techniques and apparatuses for systematic bit priority mapping (SBPM) interleaving for layers with different modulation orders.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a new radio (NR) BS, a 5G Node B, and/or the like.

The above multiple access technologies have been adopted in various telecommunication standards to provide a common protocol that enables different user equipment to communicate on a municipal, national, regional, and even global level. New radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by a transmitter, may include determining a first modulation order for a first layer of a communication and a second modulation order for a second layer of the communication, wherein the first modulation order and the second modulation order are different; interleaving bits for one or more of the first layer or the second layer based at least in part on the first modulation order and the second modulation order; and transmitting the interleaved bits via the one or more of the first layer or the second layer.

In some aspects, a transmitter for wireless communication may include memory and one or more processors operatively coupled to the memory. The memory and the one or more processors may be configured to determine a first modulation order for a first layer of a communication and a second modulation order for a second layer of the communication, wherein the first modulation order and the second modulation order are different; interleave bits for one or more of the first layer or the second layer based at least in part on the first modulation order and the second modulation order; and transmit the interleaved bits via the one or more of the first layer or the second layer.

In some aspects, a non-transitory computer-readable medium may store one or more instructions for wireless communication. The one or more instructions, when executed by one or more processors of a transmitter, may cause the one or more processors to determine a first modulation order for a first layer of a communication and a second modulation order for a second layer of the communication, wherein the first modulation order and the second modulation order are different; interleave bits for one or more of the first layer or the second layer based at least in part on the first modulation order and the second modulation order; and transmit the interleaved bits via the one or more of the first layer or the second layer.

In some aspects, an apparatus for wireless communication may include means for determining a first modulation order for a first layer of a communication and a second modulation order for a second layer of the communication, wherein the first modulation order and the second modulation order are different; means for interleaving bits for one or more of the first layer or the second layer based at least in part on the first modulation order and the second modulation order; and means for transmitting the interleaved bits via the one or more of the first layer or the second layer.

In some aspects, a method of wireless communication, performed by a receiver, may include receiving interleaved bits via a first layer of a communication and a second layer of the communication; determining a first modulation order for the first layer and a second modulation order for the second layer, wherein the first modulation order and the second modulation order are different; and de-interleaving the interleaved bits based at least in part on the first modulation order and the second modulation order.

In some aspects, a receiver for wireless communication may include memory and one or more processors operatively coupled to the memory. The memory and the one or more processors may be configured to receive interleaved bits via a first layer of a communication and a second layer of the communication; determine a first modulation order for the first layer and a second modulation order for the second layer, wherein the first modulation order and the second modulation order are different; and de-interleave the interleaved bits based at least in part on the first modulation order and the second modulation order.

In some aspects, a non-transitory computer-readable medium may store one or more instructions for wireless communication. The one or more instructions, when executed by one or more processors of a receiver, may cause the one or more processors to receive interleaved bits via a first layer of a communication and a second layer of the communication; determine a first modulation order for the first layer and a second modulation order for the second layer, wherein the first modulation order and the second modulation order are different; and de-interleave the interleaved bits based at least in part on the first modulation order and the second modulation order.

In some aspects, an apparatus for wireless communication may include means for receiving interleaved bits via a first layer of a communication and a second layer of the communication; means for determining a first modulation order for the first layer and a second modulation order for the second layer, wherein the first modulation order and the second modulation order are different; and means for de-interleaving the interleaved bits based at least in part on the first modulation order and the second modulation order.

Aspects generally include a method, apparatus, system, computer program product, non-transitory computer-readable medium, user equipment, base station, wireless communication device, and processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It is noted that while aspects may be described herein using terminology commonly associated with 3G and/or 4G wireless technologies, aspects of the present disclosure can be applied in other generation-based communication systems, such as 5G and later, including NR technologies.

Figure 1:
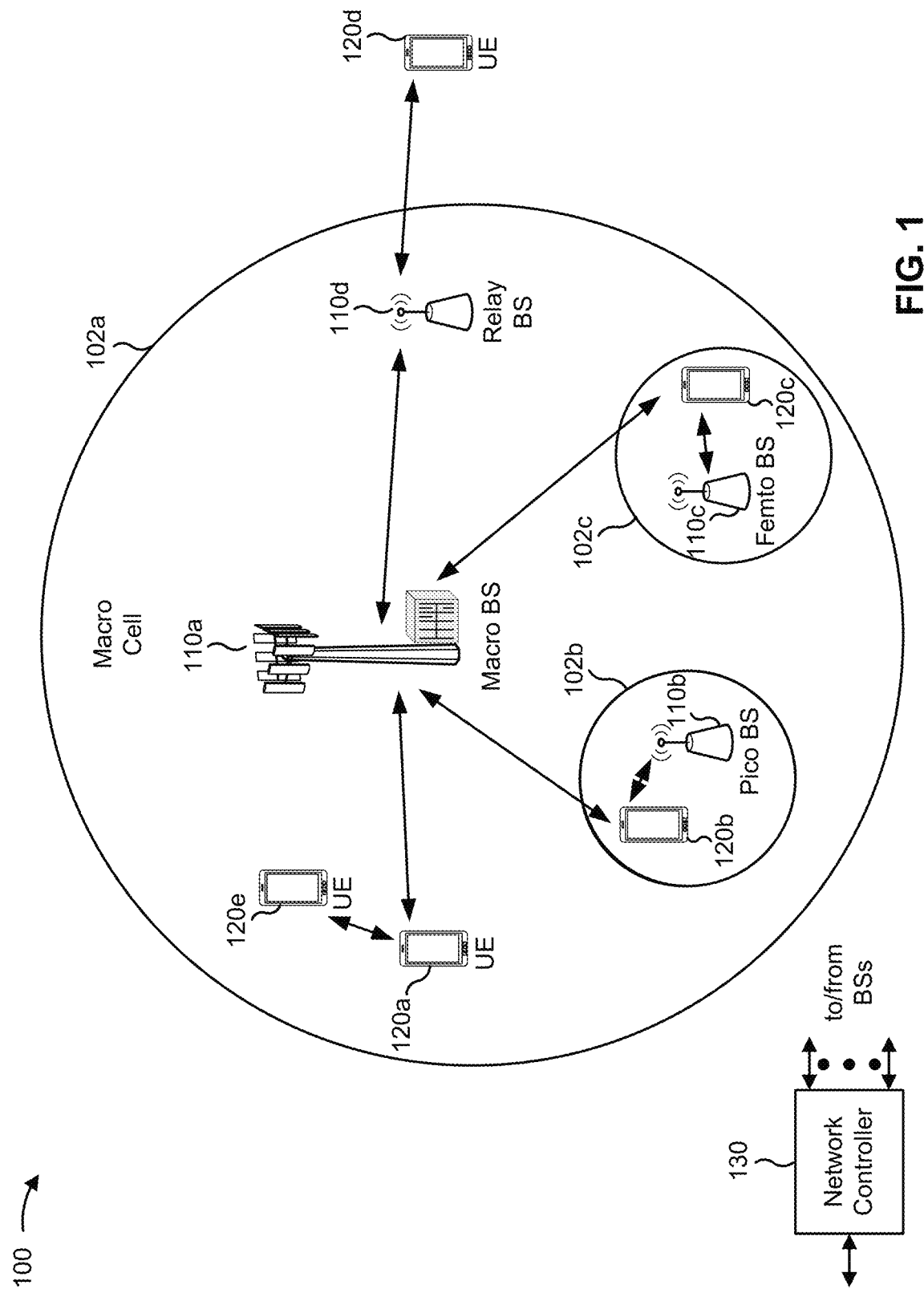
FIG. 1 is a block diagram conceptually illustrating an example of a wireless communication network, in accordance with various aspects of the present disclosure.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. ABS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impact on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, such as sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided merely as an example. Other examples are possible and may differ from what was described with regard to FIG. 1.

Figure 2:
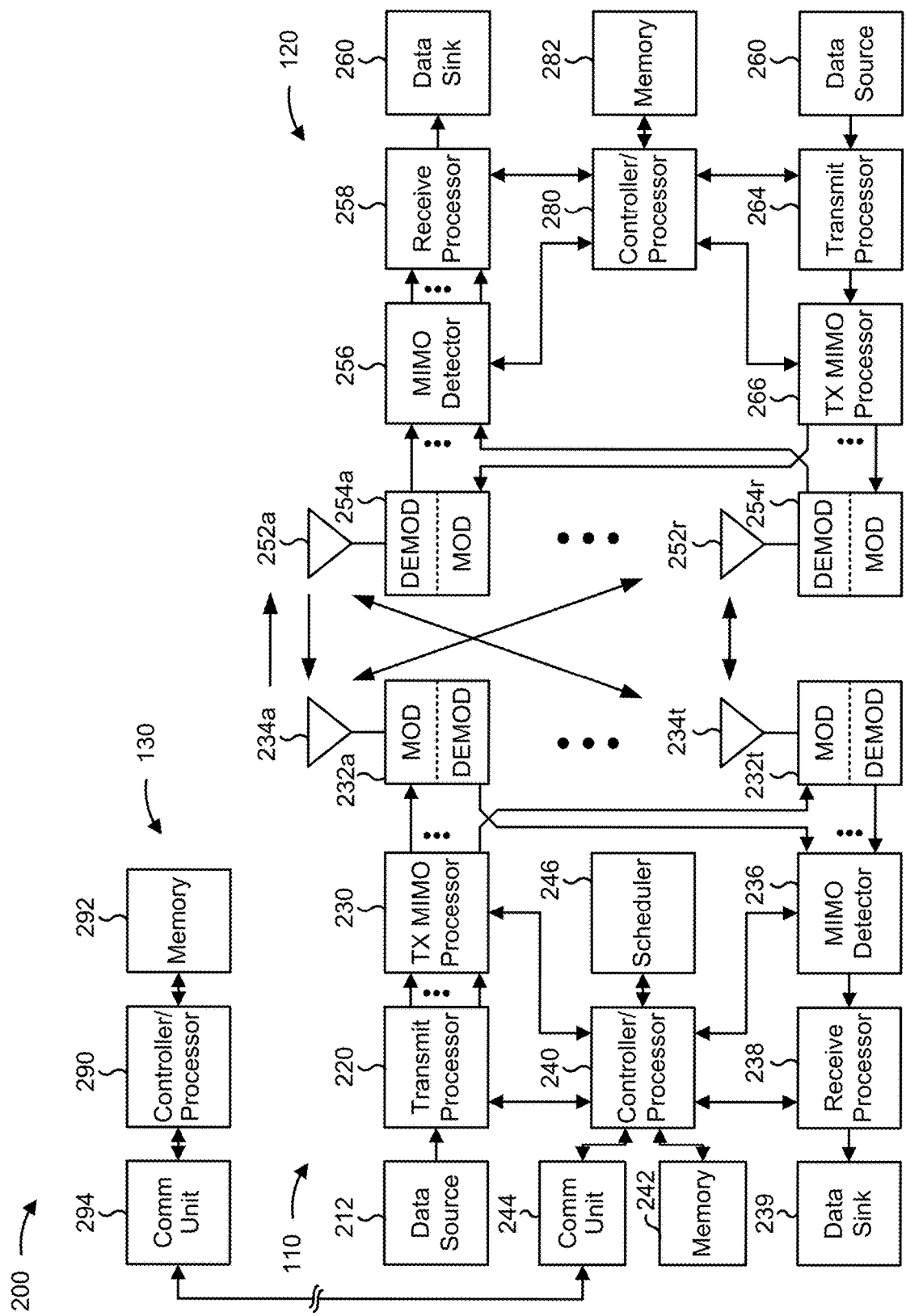
FIG. 2 is a block diagram conceptually illustrating an example of a base station in communication with a user equipment (UE) in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with systematic bit priority mapping (SBPM) interleaving for layers with different modulation orders, as described in more detail elsewhere herein. For example, controller/processor 240 of base station 110, controller/processor 280 of UE 120, and/or any other component(s) of FIG. 2 may perform or direct operations of, for example, process 1200 of FIG. 12, process 1300 of FIG. 13, and/or other processes as described herein. Memories 242 and 282 may store data and program codes for base station 110 and UE 120, respectively. A scheduler 246 may schedule UEs for data transmission on the downlink and/or uplink.

In some aspects, a receiver (e.g., UE 120) may include means for receiving interleaved bits via a first layer of a communication and a second layer of the communication; means for determining a first modulation order for the first layer and a second modulation order for the second layer, wherein the first modulation order and the second modulation order are different; means for de-interleaving the interleaved bits based at least in part on the first modulation order and the second modulation order; and/or the like. In some aspects, such means may include one or more components of UE 120 described in connection with FIG. 2.

In some aspects, a transmitter (e.g., base station 110 and/or the like) may include means for determining a first modulation order for a first layer of a communication and a second modulation order for a second layer of the communication, wherein the first modulation order and the second modulation order are different; means for interleaving bits for one or more of the first layer or the second layer based at least in part on the first modulation order and the second modulation order; means for transmitting the interleaved bits via the one or more of the first layer or the second layer; and/or the like. In some aspects, such means may include one or more components of base station 110 described in connection with FIG. 2.

As indicated above, FIG. 2 is provided merely as an example. Other examples are possible and may differ from what was described with regard to FIG. 2.

Figure 3:
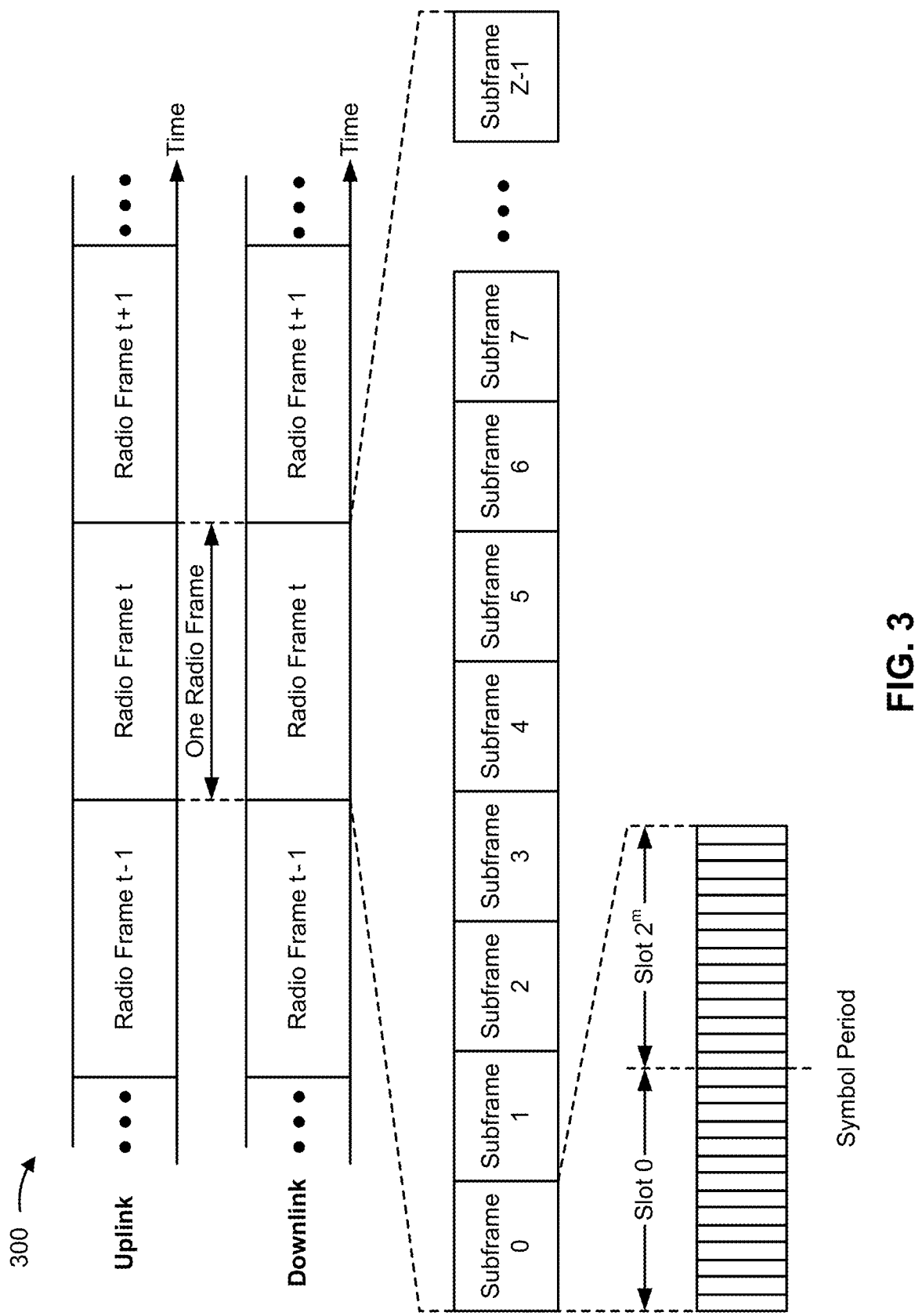
FIG. 3 is a block diagram conceptually illustrating an example of a frame structure in a wireless communication network, in accordance with various aspects of the present disclosure.

FIG. 3 shows an example frame structure 300 for FDD in a telecommunications system (e.g., NR). The transmission timeline for each of the downlink and uplink may be partitioned into units of radio frames (sometimes referred to as frames). Each radio frame may have a predetermined duration (e.g., 10 milliseconds (ms)) and may be partitioned into a set of Z (Z≥1) subframes (e.g., with indices of 0 through Z-1). Each subframe may have a predetermined duration (e.g., 1 ms) and may include a set of slots (e.g., $2^m$ slots per subframe are shown in FIG. 3, where m is a numerology used for a transmission, such as 0, 1,2, 3, 4, and/or the like). Each slot may include a set of L symbol periods. For example, each slot may include fourteen symbol periods (e.g., as shown in FIG. 3), seven symbol periods, or another number of symbol periods. In a case where the subframe includes two slots (e.g., when m=1), the subframe may include 2L symbol periods, where the 2L symbol periods in each subframe may be assigned indices of 0 through 2L-1. In some aspects, a scheduling unit for the FDD may frame-based, subframe-based, slot-based, symbol-based, and/or the like.

While some techniques are described herein in connection with frames, subframes, slots, and/or the like, these techniques may equally apply to other types of wireless communication structures, which may be referred to using terms other than "frame," "subframe," "slot," and/or the like in 5G NR. In some aspects, a wireless communication structure may refer to a periodic time-bounded communication unit defined by a wireless communication standard and/or protocol. Additionally, or alternatively, different configurations of wireless communication structures than those shown in FIG. 3 may be used.

As indicated above, FIG. 3 is provided as an example. Other examples are possible and may differ from what was described with regard to FIG. 3.

Figure 4:
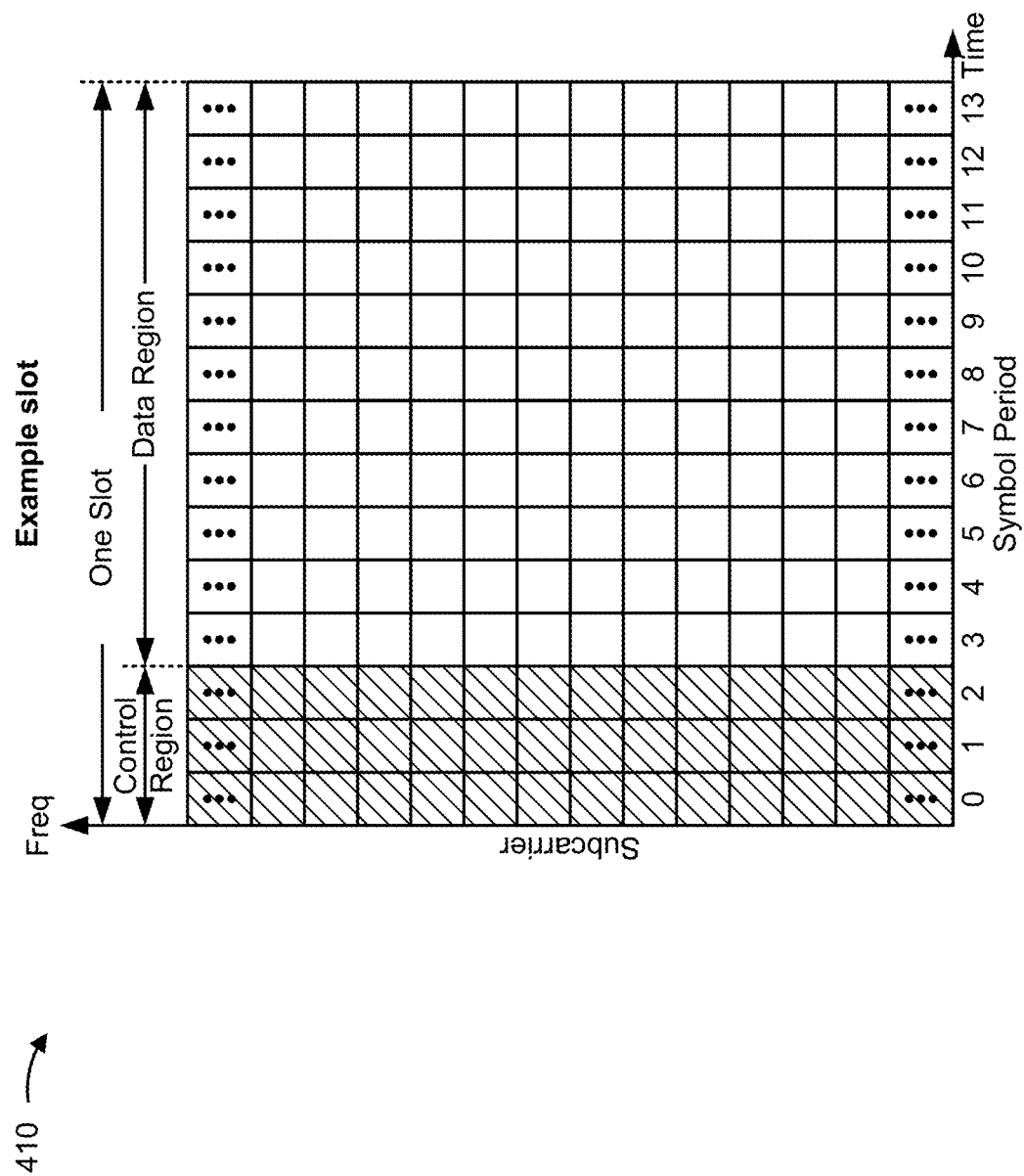
FIG. 4 is a block diagram conceptually illustrating an example slot format with a normal cyclic prefix, in accordance with various aspects of the present disclosure.

FIG. 4 shows an example slot format 410 with a normal cyclic prefix. The available time frequency resources may be partitioned into resource blocks. Each resource block may cover a set to of subcarriers (e.g., 12 subcarriers) in one slot and may include a number of resource elements. Each resource element may cover one subcarrier in one symbol period (e.g., in time) and may be used to send one modulation symbol (e.g., a modulated symbol), which may be a real or complex value.

While aspects of the examples described herein may be associated with NR or 5G technologies, aspects of the present disclosure may be applicable with other wireless communication systems. New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). In aspects, NR may utilize OFDM with a CP (herein referred to as cyclic prefix OFDM or CP-OFDM) and/or SC-FDM on the uplink, may utilize CP-OFDM on the downlink and include support for half-duplex operation using TDD. In aspects, NR may, for example, utilize OFDM with a CP (herein referred to as CP-OFDM) and/or discrete Fourier transform spread orthogonal frequency-division multiplexing (DFT-s-OFDM) on the uplink, may utilize CP-OFDM on the downlink and include support for half-duplex operation using TDD. NR may include Enhanced Mobile Broadband (eMBB) service targeting wide bandwidth (e.g., 80 megahertz (MHz) and beyond), millimeter wave (mmW) targeting high carrier frequency (e.g., 60 gigahertz (GHz)), massive MTC (mMTC) targeting non-backward compatible MTC techniques, and/or mission critical targeting ultra reliable low latency communications (URLLC) service.

In some aspects, a single component carrier bandwidth of 100 MHZ may be supported. NR resource blocks may span 12 sub-carriers with a sub-carrier bandwidth of 60 or 120 kilohertz (kHz) over a 0.1 millisecond (ms) duration. Each radio frame may include 40 slots and may have a length of 10 ms. Consequently, each slot may have a length of 0.25 ms. Each slot may indicate a link direction (e.g., DL or UL) for data transmission and the link direction for each slot may be dynamically switched. Each slot may include DL/UL data as well as DL/UL control data.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface. NR networks may include entities such central units or distributed units.

As indicated above, FIG. 4 is provided as an example. Other examples are possible and may differ from what was described with regard to FIG. 4.

Figure 5:
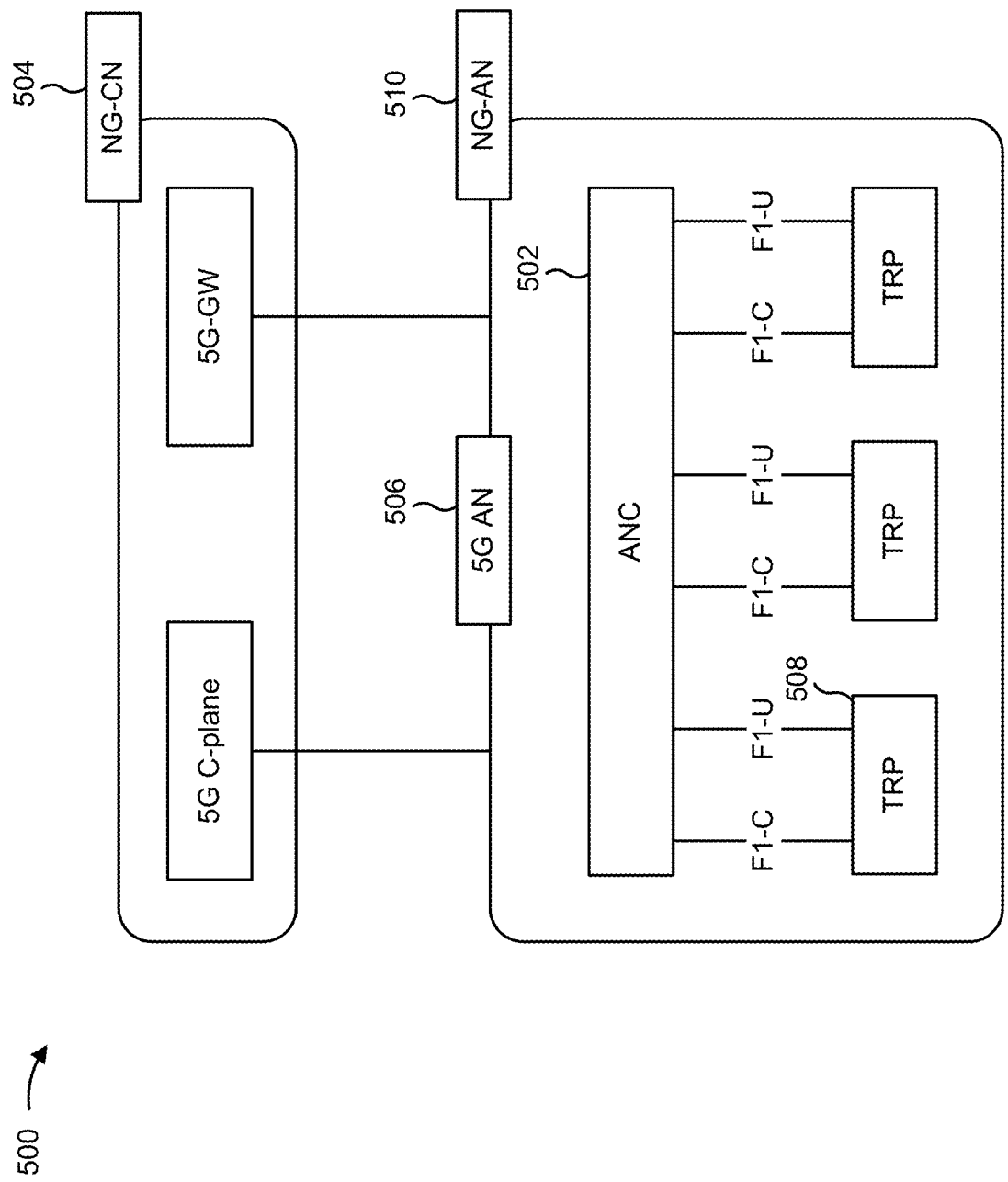
FIG. 5 illustrates an example logical architecture of a distributed radio access network (RAN), in accordance with various aspects of the present disclosure.

FIG. 5 illustrates an example logical architecture of a distributed RAN 500, according to aspects of the present disclosure.

A 5G access node 506 may include an access node controller (ANC) 502. The ANC 502 may be a central unit (CU) of the distributed RAN 500. The backhaul interface to the next generation core network (NG-CN) 504 may terminate at the ANC 502. The backhaul interface to neighboring next generation access nodes (NG-ANs) may terminate at the ANC 502. The ANC 502 may include one or more TRPs 508 (which may also be referred to as BSs, NR BSs, Node Bs, 5G NBs, APs, gNB, or some other term). As described above, a TRP 508 may be used interchangeably with "cell." In some aspects, multiple TRPs 508 may be included in a single base station 110. Additionally, or alternatively, different TRPs 508 may be included in different base stations 110.

A TRP 508 may be a distributed unit (DU). A TRP 508 may be connected to a single ANC 502 or multiple ANCs 502. For example, for RAN sharing, radio as a service (RaaS), and service specific AND deployments, the TRP 508 may be connected to more than one ANC 502. A TRP 508 may include one or more antenna ports. The TRPs 508 may be configured to individually (e.g., using dynamic selection) or jointly (e.g., using joint transmission) serve traffic to a UE 120.

The local architecture of RAN 500 may be used to illustrate fronthaul definition. The architecture may be defined to support fronthauling solutions across different deployment types. For example, the architecture may be based at least in part on transmit network capabilities (e.g., bandwidth, latency, and/or jitter). The architecture may share features and/or components with LTE. According to aspects, the next generation AN (NG-AN) 510 may support dual connectivity with NR. The NG-AN 510 may share a common fronthaul for LTE and NR. The architecture may enable cooperation between and among TRPs 508. For example, cooperation may be preset within a TRP 508 and/or across TRPs 508 via the ANC 502. In some aspects, no inter-TRP interface may be needed/present.

In some aspects, a dynamic configuration of split logical functions may be present within the architecture of RAN 500. The packet data convergence protocol (PDCP), radio link control (RLC), media access control (MAC) protocol, and/or the like may be adaptably placed at the ANC 502 or TRP 508. According to various aspects, a base station 110 may include a central unit (CU) (e.g., ANC 502) and/or one or more distributed units (e.g., one or more TRPs 508).

As indicated above, FIG. 5 is provided merely as an example. Other examples are possible and may differ from what was described with regard to FIG. 5.

Figure 6:
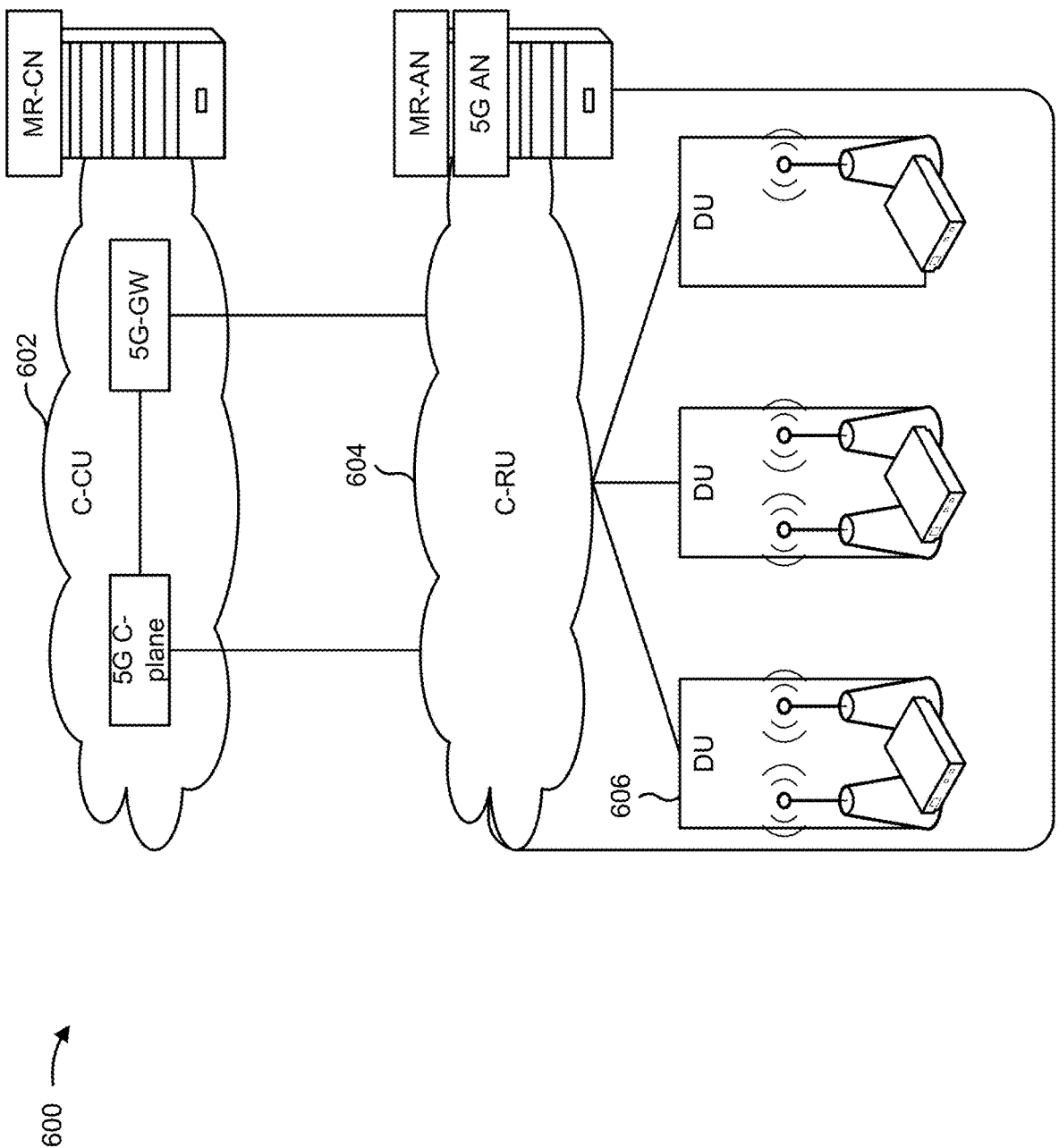
FIG. 6 illustrates an example physical architecture of a distributed RAN, in accordance with various aspects of the present disclosure.

FIG. 6 illustrates an example physical architecture of a distributed RAN 600, according to aspects of the present disclosure.

A centralized core network unit (C-CU) 602 may host core network functions. The C-CU 602 may be centrally deployed. Functionality of the C-CU 602 may be offloaded (e.g., to advanced wireless services (AWS)), in an effort to handle peak capacity. A centralized RAN unit (C-RU) 604 may host one or more ANC functions. In some aspects, the C-RU 604 may host core network functions locally. In some aspects, the C-RU 604 may have distributed deployment. A distributed unit (DU) 606 may host one or more TRPs 508. The DU 406 may be located at edges of the network with radio frequency (RF) functionality.

As indicated above, FIG. 6 is provided merely as an example. Other examples are possible and may differ from what was described with regard to FIG. 6.

Figure 7:
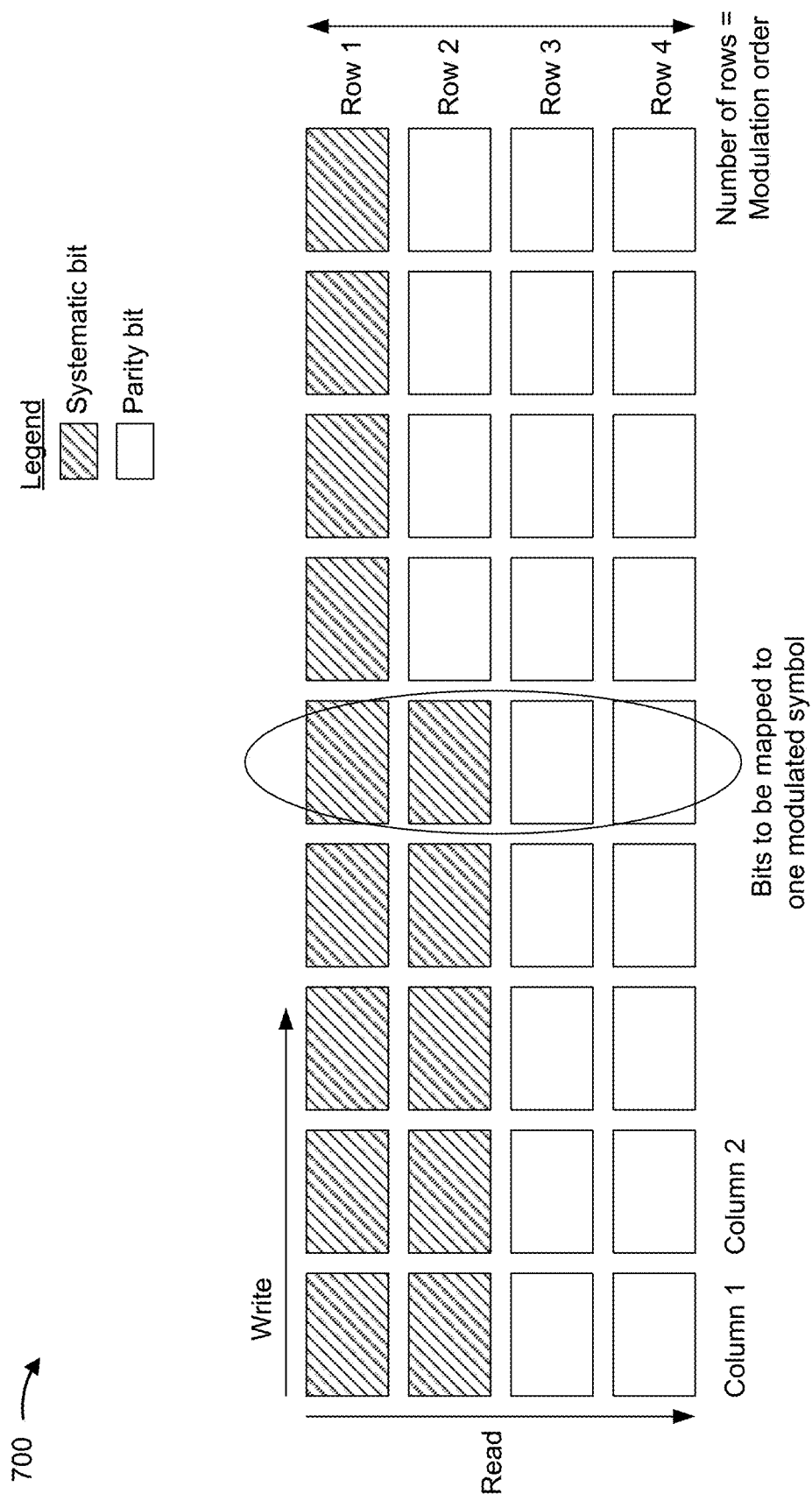
FIG. 7 is a diagram illustrating an example of interleaving, in accordance with various aspects of the present disclosure.

FIG. 7 is a diagram illustrating an example of interleaving, in accordance with various aspects of the present disclosure.

In New Radio and other types of radio access technologies, interleaving may be performed after (or as the last step of) rate matching to map bits to symbols for modulation. Interleaving may improve reliability of a transmitted communication by, for example, improving robustness of forward error correction at a receiver. For example, interleaving may result in bits, which are consecutive prior to interleaving, being spaced out (e.g., in MIMO layers, frequency, time, and/or the like) such that some of those bits are no longer consecutive. This may mitigate the effects of burst errors, thereby reducing local gaps in communications, such as gaps in voice, video, data, and/or other communications.

A communication transmitted over the air may include systematic bits (e.g., also referred to as information bits or message bits) and parity bits (e.g., also referred to as check bits), which together form coded bits (e.g., a codeword) of the communication. The systematic bits may carry the information to be conveyed, and the parity bits may be used for error detection and/or error correction (e.g., using a checksum, a cyclic redundancy check, and/or the like). In some aspects, the parity bits are a function of and/or determined based at least in part on the systematic bits.

Systematic bit priority mapping (SBPM) is a technique to map systematic bits of a communication to the most significant bits of each modulated symbol of the communication. This increases reliability due to an increased likelihood of correct demodulation of the systematic bits because the most significant bits (e.g., the most significant bit, or one or more most significant bits) of the modulated symbol have increased protection against errors as compared to the least significant bits (e.g., the least significant bit, or one or more least significant bits) of the modulated symbol. For example, even if a receiver incorrectly demodulates a modulated symbol, that incorrect demodulation is likely to correspond to a constellation point, in a constellation diagram for the modulation scheme, that is near the correct constellation point and that has one or more most significant bits in common with the correct constellation point.

An example of SBPM interleaving (e.g., using block interleaving) is shown in FIG. 7. In example 700, each block represents a bit, which may be a systematic bit or a parity bit, as shown. A column of blocks represents a number of bits that are mapped to a single symbol (e.g., a single modulated symbol). The number of bits (e.g., the number of rows in a column) is equal to the modulation order. Thus, interleaving may be a function of modulation order. In example 700, each modulated symbol represents 4 bits, such as in 16-Quadrature Amplitude Modulation (16-QAM) and/or the like, which has a modulation order of 4 (e.g., 4 bits per symbol). The number of columns may depend on the size of the communication to be transmitted. For example, the number of columns may be equal to the total number of coded bits (e.g., systematic bits plus parity bits) to be transmitted, divided by the modulation order. In example 700, there are 36 coded bits to be transmitted with a modulation order of 4, leading to 9 columns of blocks.

In some aspects, block interleaving (e.g., SBPM interleaving) may be performed using a technique called write by row, read by column. Using this technique, bits may be obtained from a circular buffer as part of a rate matching process, with a starting bit determined based at least in part on a redundancy version, of the communication, to be transmitted. As the bits are obtained, those bits may be written to blocks across a first row (shown as row 1), where each bit is placed in a different column corresponding to a different symbol. After the first row is filled, bits may be written to blocks across a second row (shown as row 2), and so on. The starting bit and a set of subsequent bits of the circular buffer may be systematic bits, and may be followed by parity bits. As a result, the first one or more rows (shown toward the top of FIG. 7) may include systematic bits, and the last one or more rows (shown toward the bottom of FIG. 7) may include parity bits.

Because the first row(s) correspond to more significant bits of the modulated symbol and the last row(s) correspond to less significant bits of the modulated symbol, this technique may map systematic bits (e.g., some, most, or all of the systematic bits, depending on a starting bit in the circular buffer) to the most significant bit(s) of the modulated symbol, thereby increasing reliability, as described above. In example 700, the first row corresponds to the most significant bit of the modulated symbol, and is filled entirely with systematic bits, and the last row correspond to the least significant bit of the modulated symbol, and is filled entirely with parity bits.

After all of the coded bits are written to the blocks, referred to as interleaving, those interleaved bits are read from the blocks down a first column (e.g., shown as column 1) as input to a modulation process to modulate those coded bits in a modulated symbol. After modulation, the coded bits in the first column will be represented as a first modulated symbol, the coded bits in a second column (e.g., shown as column 2) will be represented as a second modulated symbol, and so on. In some aspects, the interleaving and/or the modulation may be performed to first map the modulated symbols to a layer (e.g., a MIMO layer), then map the modulated symbols to a frequency, and then map the modulated symbols to time. In this way, protection from burst errors may be enhanced.

As described above, this type of interleaving depends on a modulation order of a communication to be transmitted. However, for a multi-layer communication, different layers may have different modulation orders. For example, when multiple TRPs (e.g., as part of the same base station or different base stations) transmit a communication to a UE, a first TRP may transmit on a first layer having a first modulation order (e.g., $Q_{m,1}$), and a second TRP may transmit on a second layer having a second, different, modulation order (e.g., $Q_{m,2}$). This may be due to, for example, a link imbalance between the TRPs and/or the UE. The separate layers may be transmitted on the same channel (e.g., a physical downlink shared channel (PDSCH)), or on different channels. In some aspects, different coded bits (e.g., different redundancy versions) may be transmitted on the different layers to enhance reliability. As another example, a single TRP may have different channel conditions (e.g., different degrees of fading and/or the like) on different layers, and may use different modulation orders for the different layers.

In scenarios where a communication is transmitted on different layers that use different modulation orders, SBPM interleaving becomes more complicated. Some techniques and apparatuses described herein provide high reliability in these scenarios. Additional details are described below.

As indicated above, FIG. 7 is provided merely as an example. Other examples are possible and may differ from what was described with regard to FIG. 7.

Figure 8:
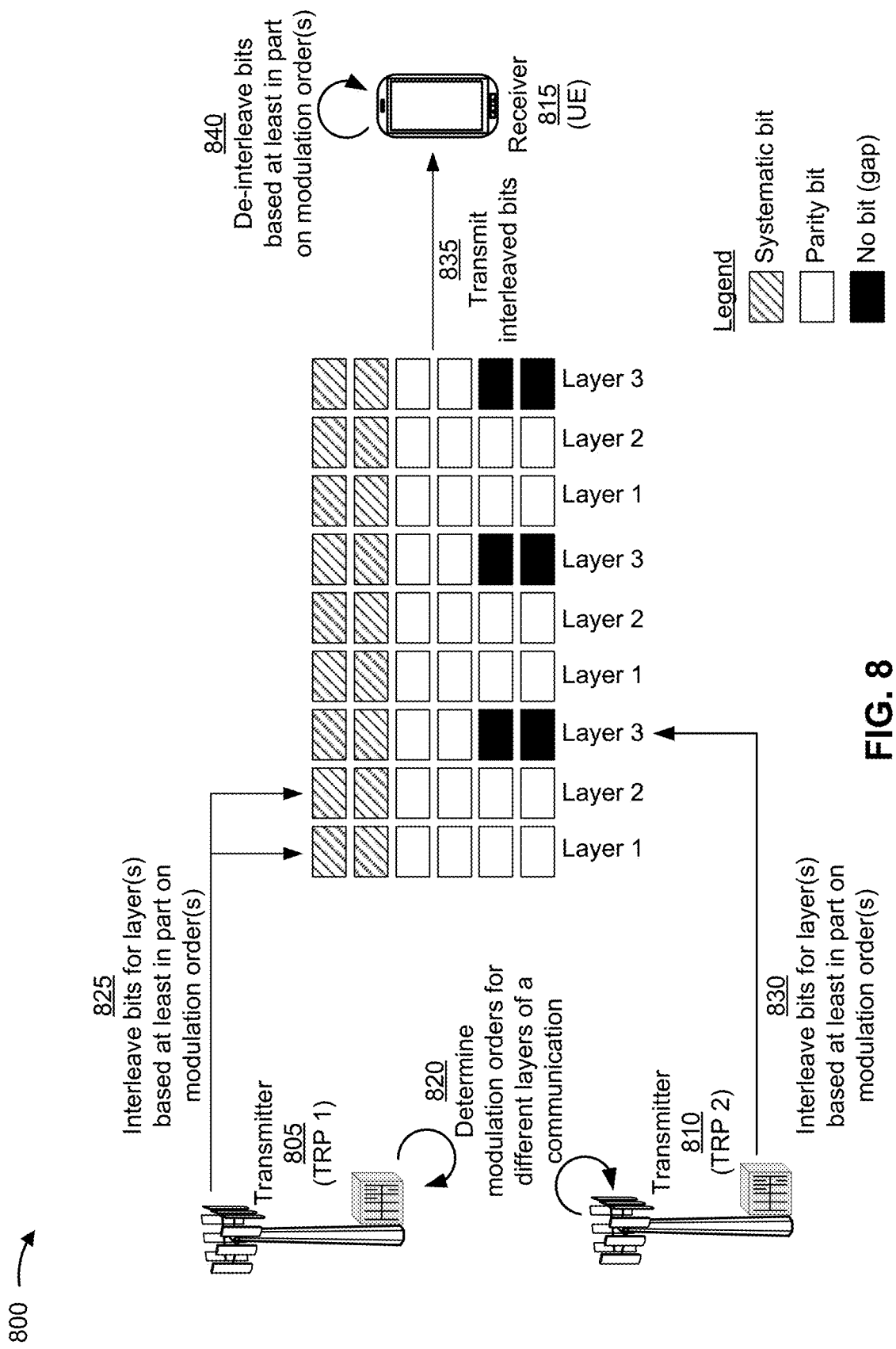
FIGS. 8-11 are diagrams illustrating examples of systematic bit priority mapping (SBPM) interleaving for layers with different modulation orders, in accordance with various aspects of the present disclosure.

FIG. 8 is a diagram illustrating an example 800 of systematic bit priority mapping (SBPM) interleaving for layers with different modulation orders, in accordance with various aspects of the present disclosure.

As shown in FIG. 8, multiple transmitters, shown as a first transmitter 805 and a second transmitter 810, may communicate with a receiver 815 using multiple layers. The transmitters 805, 810 may include TRPs 508, base stations 110, and/or the like. In some aspects, the first transmitter 805 and the second transmitter 810 may be TRPs 508 included in a single base station 110. In some aspects, the first transmitter 805 may be a first TRP 508 included in a first base station 110, and the second transmitter 810 may be a second TRP 508 included in a second base station 110. In some aspects, the receiver 815 may include a UE 120. Although two transmitters are shown, some aspects may use more than two transmitters. Alternatively, some aspects may use a single transmitter that transmits on multiple layers having different modulation orders.

As shown by reference number 820, the first transmitter 805 and/or the second transmitter 810 may determine modulation orders for different layers of a communication. For example, the first transmitter 805 and/or the second transmitter 810 may determine a first modulation order for a first layer of a communication and/or a second modulation order for a second layer of the communication. The first modulation order and the second modulation order may be different. In some aspects, the transmitters 805, 810 may coordinate the communication such that the layers and/or the modulation orders to be used by both transmitters 805, 810 are known to each transmitter 805, 810 (e.g., via inter-TRP messaging). Alternatively, a transmitter 805, 810 may act independently based at least in part on the layer and/or modulation order associated with that transmitter 805, 810.

As shown by reference number 825, the first transmitter 805 may interleave bits for one or more first layers to be transmitted by the first transmitter 805, shown as Layer 1 and Layer 2. Such interleaving may be performed based at least in part on the first modulation order and/or the second modulation order. Similarly, as shown by reference number 830, the second transmitter 810 may interleave bits for one or more second layers to be transmitted by the second transmitter 810, shown as Layer 3. Such interleaving may be performed based at least in part on the first modulation order and/or the second modulation order.

As shown, the interleaving may be performed to map systematic bits of the communication to one or more most significant bits of each modulated symbol of a set of modulated symbols associated with the communication. For example, the systematic bits are shown in the top two rows of a block interleaving table, which represent the two most significant bits of the modulated symbol. In example 800, the set of modulated symbols includes 9 modulated symbols (e.g., represented by 9 columns of blocks), with the first modulated symbol being associated with Layer 1, the second modulated symbol being associated with Layer 2, the third modulated symbol being associated with Layer 3, the fourth modulated symbol being associated with Layer 1 (e.g., wrapping around to Layer 1), and so on. Thus, a first subset of the set of modulated symbols (e.g., symbols 1, 2, 4, 5, 7, and 8) are associated with a first set of layers (e.g., Layer 1 and Layer 2) of the first transmitter 805, and a second subset of the set of modulated symbols (e.g., symbols 3, 6, and 9) are associated with a second set of layers (e.g., Layer 3) of the second transmitter 810. In this case, first systematic bits are mapped to the first subset of modulated symbols, and second systematic bits are mapped to the second subset of modulated symbols.

As shown, the coded bits may be interleaved based at least in part on one or more gaps where a bit is not mapped to a modulated symbol. The one or more gaps may prevent a corresponding one or more bits from being mapped to a layer with a lower modulation order as compared to one or more other layers. In example 800, Layer 3 is associated with a modulation order of 4 (e.g., 4 bits per symbol, such as in 16-QAM and/or the like), whereas Layers 1 and 2 are associated with modulation order of 6 (e.g., 6 bits per symbol, such as in 64-QAM and/or the like). In this case, there are 2 gaps in the columns of blocks that represent bits to be mapped to a modulated symbol to be transmitted in Layer 3. The size of the gap is equal to the difference in the size of the modulation order (e.g., 6−4=2 block gap).

In some aspects, the one or more gaps (e.g., a position of the one or more gaps in a block interleaving table) may be indicated by the first transmitter 805 and/or the second transmitter 810 to the receiver 815. In some aspects, the gaps may be indicated by indicating the first modulation order and the second modulation order (e.g., in downlink control information (DCI) and/or the like), which may be used by the receiver 815 to determine an interleaving behavior (e.g., resulting from the gaps). This interleaving behavior may be used by the receiver 815 to properly de-interleave the communication on the different layers. For example, the interleaving behavior may indicate a pattern used to map coded bits to modulated symbol bits on the first layer and/or the second layer. The receiver 815 may perform de-interleaving based at least in part on this pattern.

As shown by reference number 835, the first transmitter 805 and the second transmitter 810 may transmit the interleaved bits to the receiver 815 (e.g., after modulation, or mapping the interleaved bits to modulated symbols). For example, the first transmitter 805 may transmit interleaved bits via the one or more first layers, shown as Layer 1 and Layer 2, and the second transmitter 810 may transmit interleaved bits via the one or more second layers, shown as Layer 3.

As shown by reference number 840, the receiver 815 may de-interleave the bits based at least in part on the first modulation order and/or the second modulation order. For example, the receiver 815 may use the first modulation order, the second modulation order, and/or one or more other indications of an interleaving behavior to determine a pattern to be used to properly de-interleave the bits.

As indicated above, FIG. 8 is provided merely as an example. Other examples are possible and may differ from what was described with regard to FIG. 8.

Figure 9:
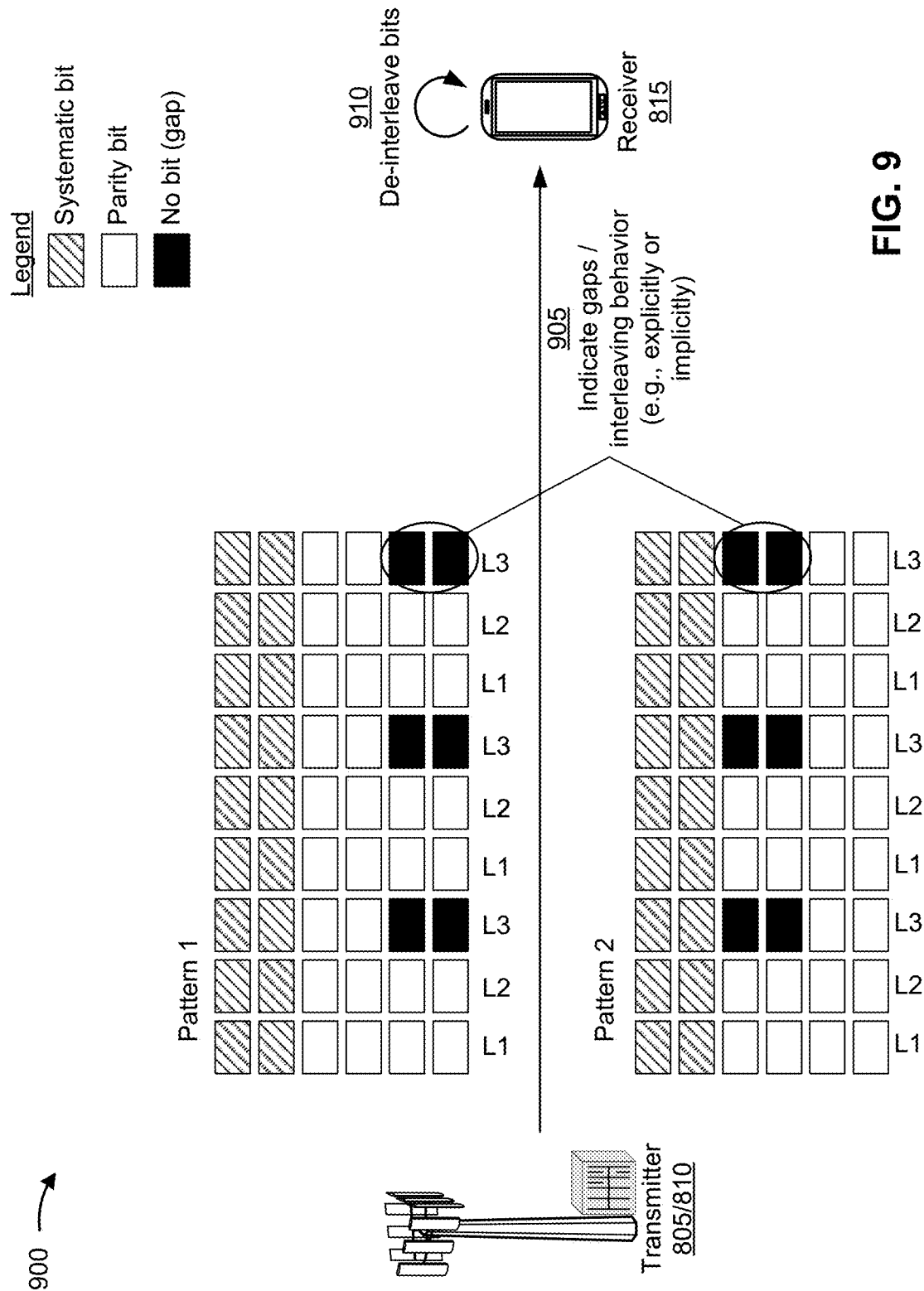

FIG. 9 is a diagram illustrating an example 900 of SBPM interleaving for layers with different modulation orders, in accordance with various aspects of the present disclosure.

As shown in FIG. 9, a transmitter 805, 810 may determine an interleaving pattern to be used to perform interleaving. The interleaving pattern may indicate one or more gaps where a bit is not mapped to a modulated symbol, as described above. In some aspects, a location of the gaps associated with a layer may be determined based at least in part on one or more interleaving factors, such as reliability of the layer, a channel condition associated with the layer, and/or the like.

As shown by reference number 905, an interleaving behavior may be indicated to the receiver 815. In some aspects, the interleaving behavior may indicate a manner in which bits are to be de-interleaved. For example, the interleaving behavior may indicate an order in which bits are to be read or de-interleaved, a pattern to be used to obtain coded bits from modulated symbols and/or to subsequently read those coded bits in a proper order, and/or the like. In some aspects, the interleaving behavior may indicate the one or more gaps (e.g., a position of the one or more gaps in a block interleaving table). Additionally, or alternatively, the interleaving behavior may be indicated by indicating the first modulation order, the second modulation order, first channel information associated with a first layer, second channel information associated with a second layer, and/or the like. In some aspects, the interleaving behavior may be indicated in DCI.

As shown by reference number 910, the receiver 815 may perform de-interleaving based at least in part on the indicated interleaving behavior. For example, the receiver 815 may receive interleaved bits (e.g., in modulated symbols) on a first set of layers (shown as Layer 1 and Layer 2) and a second set of layers (shown as Layer 3). The receiver 815 may determine interleaving behavior, which may be indicated by a first modulation order associated with the first set of layers and a second (e.g., different) modulation order associated with the second set of layers. The receiver 815 may de-interleave the interleaved bits based at least in part on the interleaving behavior (e.g., based at least in part on the first modulation order and the second modulation order).

For example, such de-interleaving may include obtaining systematic bits of the communication from one or more most significant bits of a set of modulated symbols associated with the communication. In this way, reliability of multi-layer communications, with different modulation orders for different layers, may be improved.

As indicated above, FIG. 9 is provided merely as an example. Other examples are possible and may differ from what was described with regard to FIG. 9.

Figure 10:
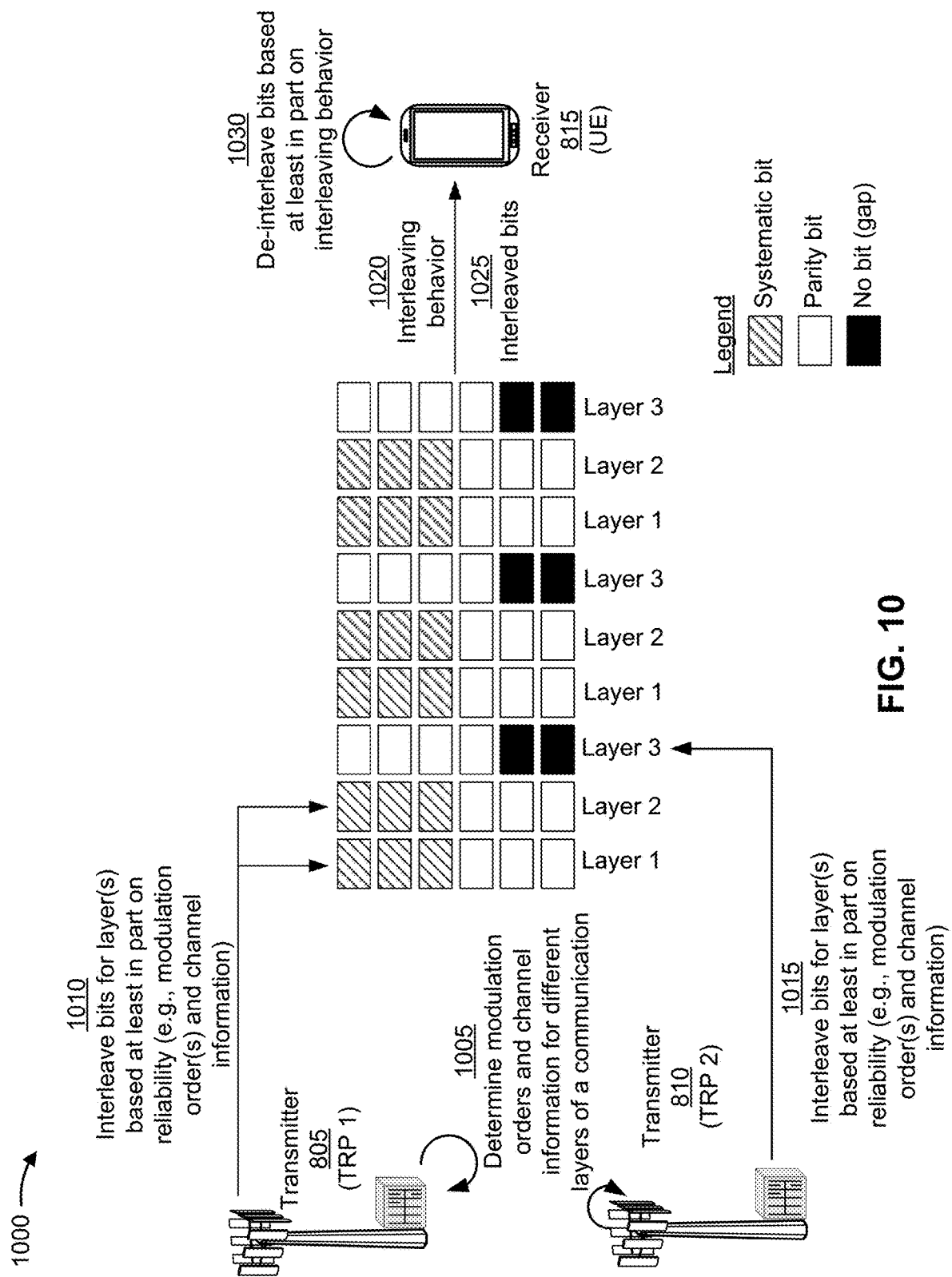

FIG. 10 is a diagram illustrating an example 1000 of SBPM interleaving for layers with different modulation orders, in accordance with various aspects of the present disclosure.

As shown by reference number 1005, in some aspects, the first transmitter 805 and/or the second transmitter 810 may determine modulation orders and channel information for different layers of a communication. For example, the first transmitter 805 and/or the second transmitter 810 may determine a first modulation order for a first layer of a communication and/or a second modulation order for a second layer of the communication. As described above, the first modulation order and the second modulation order may be different. Additionally, or alternatively, the first transmitter 805 and/or the second transmitter 810 may determine first channel information for the first layer and/or second channel information for the second layer. In some aspects, the first channel information and the second channel information may be different.

In some aspects, channel information may be represented by signal-to-noise-plus-interference-ratio (SINR) values. In this case, the first channel information may be represented by a first SINR value (e.g., within a first range of SINR values), and the second channel information may be represented by a second SINR value (e.g., within a second range of SINR values). In some aspects, the first channel information and/or the second channel information may be determined based at least in part on sounding reference signals (SRS) received from the receiver 815, channel state information (CSI) reported by the receiver 815 (e.g., using CSI reference signals (CSI-RS)), and/or the like.

As shown by reference number 1010, the first transmitter 805 may interleave bits for one or more first layers to be transmitted by the first transmitter 805, shown as Layer 1 and Layer 2. Such interleaving may be performed based at least in part on the first modulation order, the second modulation order, the first channel information, and/or the second channel information. For example, the first transmitter 805 may interleave bits on the one or more first layers based at least in part on a first reliability associated with the one or more first layers. In some aspects, the first reliability may be determined based at least in part on the first modulation order and the first channel information.

Similarly, as shown by reference number 1015, the second transmitter 810 may interleave bits for one or more second layers to be transmitted by the second transmitter 810, shown as Layer 3. Such interleaving may be performed based at least in part on the first modulation order, the second modulation order, the first channel information, and/or the second channel information. For example, the second transmitter 810 may interleave bits on the one or more second layers based at least in part on a second reliability associated with the one or more second layers. In some aspects, the second reliability may be determined based at least in part on the second modulation order and the second channel information.

In example 1000, the set of first layers (e.g., Layer 1 and Layer 2) has a higher reliability than the set of second layers (e.g., Layer 3). In this case, the transmitters 805, 810 may interleave bits such that one or more systematic bits are mapped to one or more most significant bits of a set of modulated symbols associated with the set of first layers (e.g., Layer 1 and Layer 2), and may refrain from mapping any systematic bits to modulated symbols associated with the set of second layers (e.g., Layer 3). In example 1000, systematic bits are not mapped to the most significant bits of Layer 3 due to a lower reliability (e.g., below a threshold) of Layer 3 as compared to Layers 1 and 2. In some aspects, a smaller number of systematic bits may be mapped to a corresponding smaller number of most significant bits of Layer 3, and a larger number of systematic bits may be mapped to a corresponding larger number of most significant bits of each of Layer 1 and Layer 2 (e.g., when Layer 3 has a lower reliability than Layer 1 and/or Layer 2). In this way, reliability may be improved.

As shown by reference number 1020, the first transmitter 805 and/or the second transmitter 810 may indicate an interleaving behavior to the receiver 815, as described above. In some aspects, the interleaving behavior may be indicated by indicating the first channel information and/or the second channel information (e.g., the first SINR value and/or the second SINR value). Additionally, or alternatively, the interleaving behavior may be indicated by indicating the first reliability and/or the second reliability (e.g., one or more values indicating the first reliability and/or the second reliability).

As described in more detail below in connection with FIG. 11, one or more interleaving factors, such as a first modulation order for a first layer, a second modulation order for a second layer, first channel information for the first layer, second channel information for the second layer, a first reliability of the first layer, a second reliability of the second layer, and/or the like, may be different for different sub-bands (e.g., different frequencies, different groups of resource blocks, and/or the like). In this case, the interleaving behavior may be indicated for a specific sub-band or one or more sub-bands in which the communication is transmitted.

As shown by reference number 1025, the transmitters 805, 810 may transmit the interleaved bits to the receiver 815, as described above. As shown by reference number 1030, the receiver 815 may de-interleave the bits. In some aspects, the receiver 815 may de-interleave the bits based at least in part on an indicated interleaving behavior, as described elsewhere herein. In this way, reliability of multi-layer communications, with different modulation orders for different layers, may be improved.

As indicated above, FIG. 10 is provided merely as an example. Other examples are possible and may differ from what was described with regard to FIG. 10.

Figure 11:
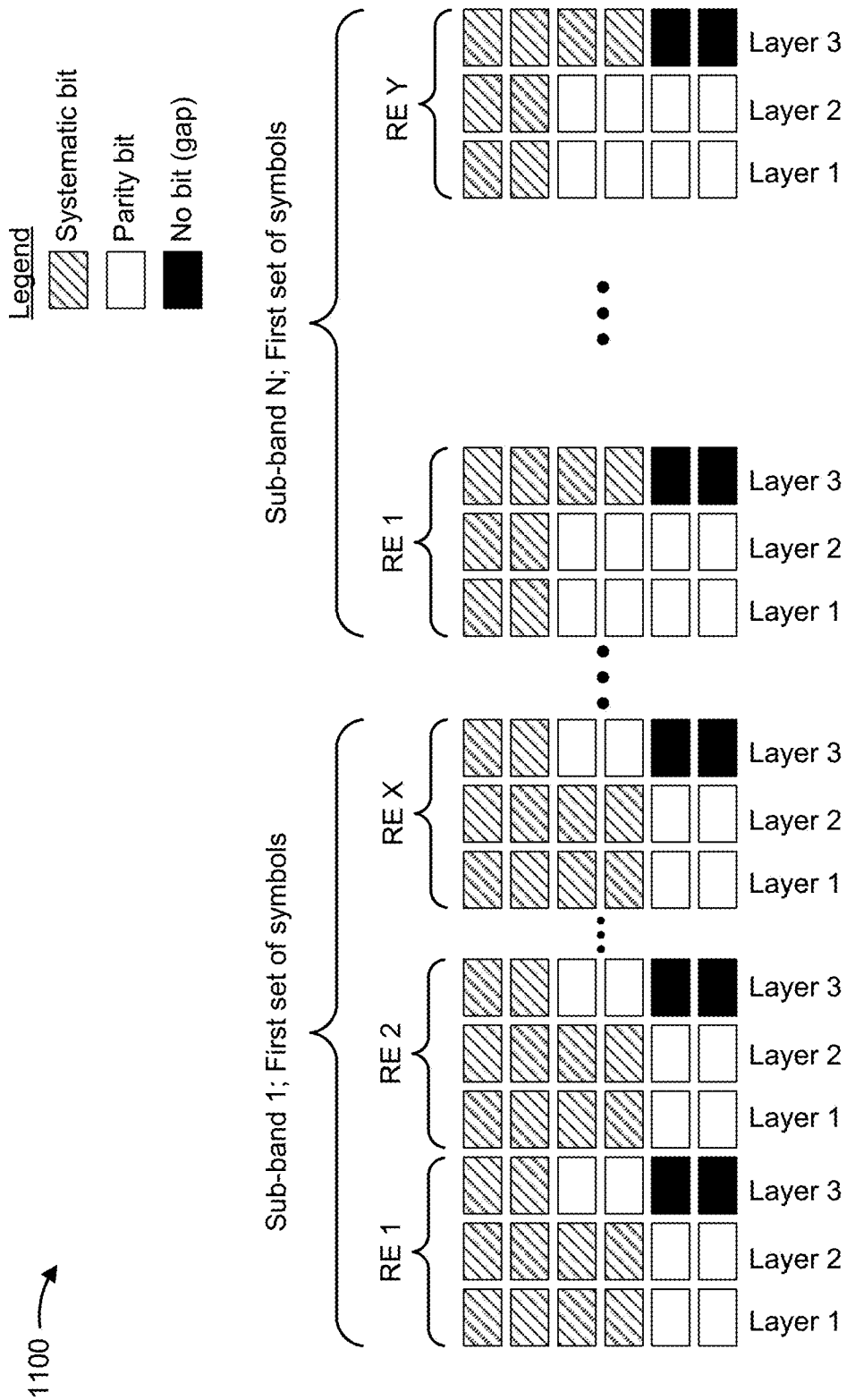

FIG. 11 is a diagram illustrating an example 1100 of SBPM interleaving for layers with different modulation orders, in accordance with various aspects of the present disclosure.

FIG. 11 shows an example where different sub-bands (e.g., different resource blocks having different frequencies) may be associated with different interleaving behaviors for the same layers (e.g., in the same set of symbols). For example, in a first set of symbols of a first sub-band (e.g., shown as sub-band 1), a greater number of systematic bits (e.g., shown as 4 systematic bits) may be mapped to a corresponding number of most significant bits (e.g., the 4 most significant bits) in a first set of layers (e.g., Layer 1 and Layer 2) having a higher reliability, and a lesser number of systematic bits (e.g., shown as 2 systematic bits) may be mapped to a corresponding number of most significant bits (e.g., the 2 most significant bits) in a second set of layers (e.g., Layer 3) having a lower reliability.

However, in the same set of symbols on a second sub-band (shown as sub-band N), a lesser number of systematic bits (e.g., shown as 2 systematic bits) may be mapped to a corresponding number of most significant bits (e.g., the 2 most significant bits) in the first set of layers (e.g., Layer 1 and Layer 2), and a greater number of systematic bits (e.g., shown as 4 systematic bits) may be mapped to a corresponding number of most significant bits (e.g., the 4 most significant bits) in a second set of layers (e.g., Layer 3). This different mapping may be due to the second set of layers having a higher reliability than the first set of layers in the second sub-band, whereas the second set of layers has a lower reliability than the first set of layers in the first sub-band. In this way, reliability may be improved at a sub-band specific level.

Thus, in the case where a first number of systematic bits of a communication are mapped to a corresponding first number of most significant bits of a set of modulated symbols associated with a first layer, and a second number of systematic bits of the communication are mapped to a corresponding second number of most significant bits of a set of modulated symbols associated with the second layer, a transmitter 805, 810 may determine the first number and/or the second number based at least in part on a sub-band in which the communication is to be transmitted. Additionally, or alternatively, the transmitter 805, 810 may determine the first number and/or the second number based at least in part on a first reliability of the first layer (e.g., which may be based at least in part on the first modulation order and/or the first channel information) and/or a second reliability of the second layer (e.g., which may be based at least in part on the second modulation order and/or the second channel information).

In this case, the different reliabilities may be due to different modulation orders used for a same layer on different sub-bands, different channel information for a same layer on different sub-bands, and/or the like. Thus, a transmitter 805, 810 may determine a modulation order for a layer, channel information for a layer, reliability for a layer, and/or the like, at a sub-band-specific granularity. In this way, reliability may be improved at a sub-band specific level.

As indicated above, FIG. 11 is provided merely as an example. Other examples are possible and may differ from what was described with regard to FIG. 11.

Figure 12:
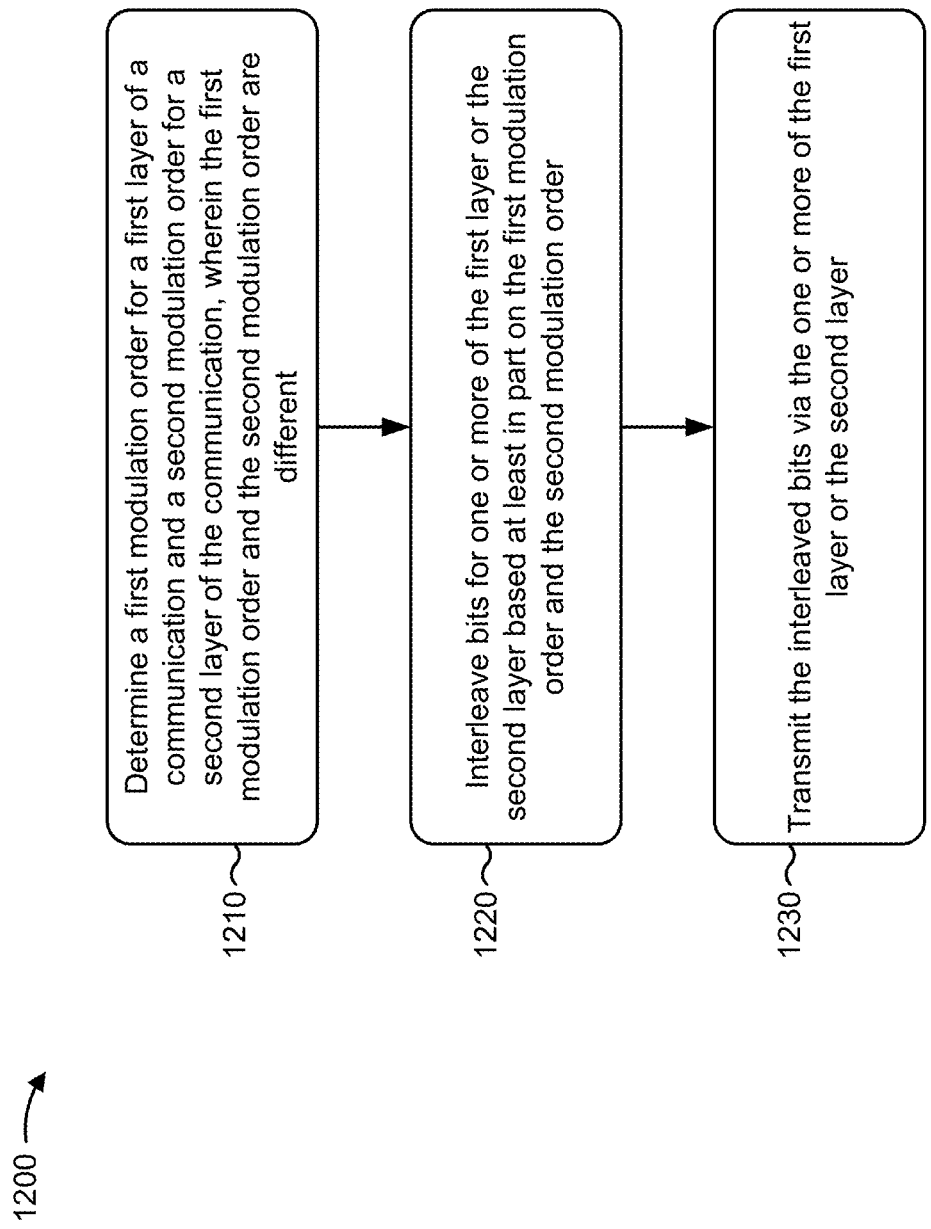
FIGS. 12-13 are diagrams illustrating example processes relating to systematic bit priority mapping (SBPM) interleaving for layers with different modulation orders, in accordance with various aspects of the present disclosure.

FIG. 12 is a diagram illustrating an example process 1200 performed, for example, by a transmitter, in accordance with various aspects of the present disclosure. Example process 1200 is an example where a transmitter (e.g., TRP 508, base station 110, and/or the like) performs operations relating to SBPM interleaving for layers with different modulation orders.

As shown in FIG. 12, in some aspects, process 1200 may include determining a first modulation order for a first layer of a communication and a second modulation order for a second layer of the communication, wherein the first modulation order and the second modulation order are different (block 1210). For example, the transmitter (e.g., using controller/processor 240 and/or the like) may determine a first modulation order for a first layer of a communication and a second modulation order for a second layer of the communication, as described above. In some aspects, the first modulation order and the second modulation order are different.

As shown in FIG. 12, in some aspects, process 1200 may include interleaving bits for one or more of the first layer or the second layer based at least in part on the first modulation order and the second modulation order (block 1220). For example, the transmitter (e.g., using controller/processor 240, transmit processor 220, TX MIMO processor 230, MOD 232, antenna 234, an interleaver, and/or the like) may interleave bits for one or more of the first layer or the second layer based at least in part on the first modulation order and the second modulation order, as described above.

As shown in FIG. 12, in some aspects, process 1200 may include transmitting the interleaved bits via the one or more of the first layer or the second layer (block 1230). For example, the transmitter (e.g., using controller/processor 240, transmit processor 220, TX MIMO processor 230, MOD 232, antenna 234, and/or the like) may transmit the interleaved bits via the one or more of the first layer or the second layer, as described above.

Process 1200 may include additional aspects, such as any single aspect or any combination of aspects described below and/or in connection with one or more other processes described elsewhere herein.

In a first aspect, interleaving the bits comprises mapping systematic bits of the communication to one or more most significant bits of each modulated symbol of a set of modulated symbols associated with the communication.

In a second aspect, alone or in combination with the first aspect, the set of modulated symbols includes a first subset of modulated symbols associated with the first layer and a second subset of modulated symbols associated with the second layer.

In a third aspect, alone or in combination with one or more of the first and second aspects, mapping the systematic bits comprises at least one of: mapping first systematic bits to the first subset of modulated symbols, mapping second systematic bits to the second subset of modulated symbols, or a combination thereof.

In a fourth aspect, alone or in combination with one or more of the first through third aspects, the bits are interleaved based at least in part on one or more gaps where a bit is not mapped to a modulated symbol.

In a fifth aspect, alone or in combination with one or more of the first through fourth aspects, the one or more gaps are used to prevent a corresponding one or more bits from being mapped to a layer, of the first layer or the second layer, that has a lower modulation order of the first modulation order or the second modulation order.

In a sixth aspect, alone or in combination with one or more of the first through fifth aspects, the one or more gaps are indicated to a receiver.

In a seventh aspect, alone or in combination with one or more of the first through sixth aspects, the first modulation order and the second modulation order are indicated to a receiver.

In an eighth aspect, alone or in combination with one or more of the first through seventh aspects, the bits are interleaved based at least in part on first channel information associated with the first layer and second channel information associated with the second layer.

In a ninth aspect, alone or in combination with one or more of the first through eighth aspects, the first channel information and the second channel information are different.

In a tenth aspect, alone or in combination with one or more of the first through ninth aspects, the first channel information includes a first signal to interference plus noise ratio (SINR) value and the second channel information includes a second SINR value.

In an eleventh aspect, alone or in combination with one or more of the first through tenth aspects, the first channel information and the second channel information are determined based at least in part on: sounding reference signals, channel state information, or a combination thereof.

In a twelfth aspect, alone or in combination with one or more of the first through eleventh aspects, the first channel information and the second channel information are determined for a sub-band in which the communication is to be transmitted.

In a thirteenth aspect, alone or in combination with one or more of the first through twelfth aspects, at least one of the first channel information or the second channel information is different for different sub-bands.

In a fourteenth aspect, alone or in combination with one or more of the first through thirteenth aspects, at least one of the first modulation order or the second modulation order is different for different sub-bands.

In a fifteenth aspect, alone or in combination with one or more of the first through fourteenth aspects, the bits are interleaved based at least in part on a first reliability associated with the first layer and a second reliability associated with the second layer.

In a sixteenth aspect, alone or in combination with one or more of the first through fifteenth aspects, the first reliability and the second reliability are determined based at least in part on: the first modulation order and the second modulation order, first channel information associated with the first layer and second channel information associated with the second layer, or a combination thereof.

In a seventeenth aspect, alone or in combination with one or more of the first through sixteenth aspects, the first reliability and the second reliability are determined for a sub-band in which the communication is to be transmitted In an eighteenth aspect, alone or in combination with one or more of the first through seventeenth aspects, interleaving the bits comprises: mapping one or more systematic bits of the communication to one or more most significant bits of a set of modulated symbols associated with the first layer, wherein the first layer has a first reliability that is greater than a second reliability of the second layer; and refraining from mapping any systematic bits of the communication to modulated symbols associated with the second layer.

In a nineteenth aspect, alone or in combination with one or more of the first through eighteenth aspects, interleaving the bits comprises: mapping a first number of systematic bits of the communication to a corresponding first number of most significant bits of a set of modulated symbols associated with the first layer; and mapping a second number of systematic bits of the communication to a corresponding second number of most significant bits of a set of modulated symbols associated with the second layer, wherein the first number and the second number are different.

In a twentieth aspect, alone or in combination with one or more of the first through nineteenth aspects, at least one of the first number or the second number depends on a sub-band in which the communication is to be transmitted.

In a twenty-first aspect, alone or in combination with one or more of the first through twentieth aspects, an interleaving behavior, to be used for performing de interleaving, is indicated to a receiver.

In a twenty-second aspect, alone or in combination with one or more of the first through twenty-first aspects, the interleaving behavior indicates a pattern associated with mapping coded bits to modulated symbol bits of at least one of the first layer or the second layer.

In a twenty-third aspect, alone or in combination with one or more of the first through twenty-second aspects, the interleaving behavior is indicated in downlink control information.

Although FIG. 12 shows example blocks of process 1200, in some aspects, process 1200 may include additional blocks, fewer blocks, different blocks, or differently arranged blocks than those depicted in FIG. 12. Additionally, or alternatively, two or more of the blocks of process 1200 may be performed in parallel.

Figure 13:
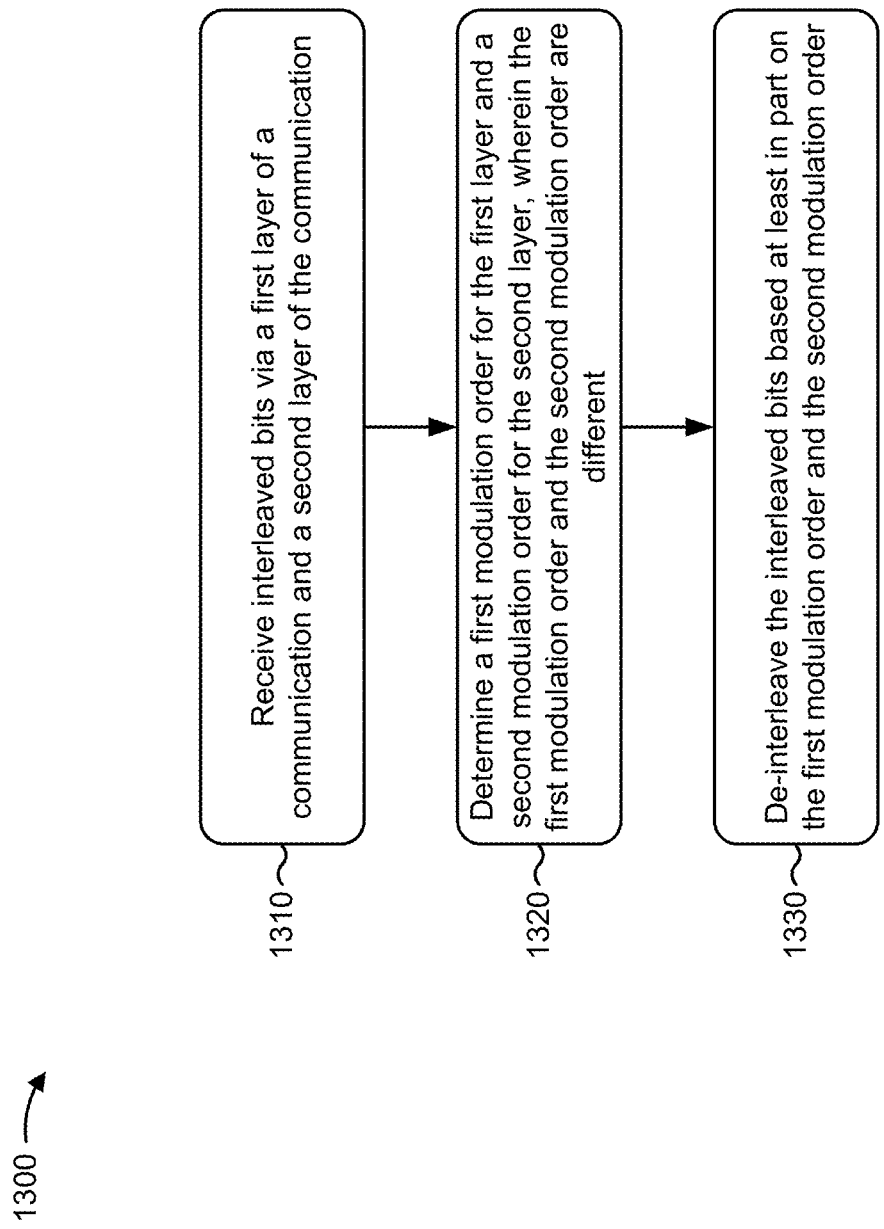

FIG. 13 is a diagram illustrating an example process 1300 performed, for example, by a receiver, in accordance with various aspects of the present disclosure. Example process 1300 is an example where a receiver (e.g., UE 120, and/or the like) performs operations relating to SBPM de-interleaving for layers with different modulation orders.

As shown in FIG. 13, in some aspects, process 1300 may include receiving interleaved bits via a first layer of a communication and a second layer of the communication (block 1310). For example, the receiver (e.g., using antenna 252, DEMOD 254, MIMO detector 256, receive processor 258, controller/processor 280, and/or the like) may receive interleaved bits via a first layer of a communication and a second layer of the communication, as described above.

As shown in FIG. 13, in some aspects, process 1300 may include determining a first modulation order for the first layer and a second modulation order for the second layer, wherein the first modulation order and the second modulation order are different (block 1320). For example, the receiver (e.g., using controller/processor 280 and/or the like) may determine a first modulation order for the first layer and a second modulation order for the second layer, as described above. In some aspects, the first modulation order and the second modulation order are different.

As shown in FIG. 13, in some aspects, process 1300 may include de-interleaving the interleaved bits based at least in part on the first modulation order and the second modulation order (block 1330). For example, the UE (e.g., using antenna 252, DEMOD 254, MIMO detector 256, receive processor 258, controller/processor 280, and/or the like) may de-interleave the interleaved bits based at least in part on the first modulation order and the second modulation order, as described above.

Process 1300 may include additional aspects, such as any single aspect or any combination of aspects described below and/or in connection with one or more other processes described elsewhere herein.

In a first aspect, de-interleaving the bits comprises obtaining systematic bits of the communication from one or more most significant bits of a set of modulated symbols associated with the communication.

In a second aspect, alone or in combination with the first aspect, the set of modulated symbols includes a first subset of modulated symbols associated with the first layer and a second subset of modulated symbols associated with the second layer.

In a third aspect, alone or in combination with one or more of the first and second aspects, obtaining the systematic bits comprises at least one of: obtaining first systematic bits from the first subset of modulated symbols, obtaining second systematic bits from the second subset of modulated symbols, or a combination thereof.

In a fourth aspect, alone or in combination with one or more of the first through third aspects, the bits are de-interleaved based at least in part on one or more gaps where a bit is not mapped to a modulated symbol.

In a fifth aspect, alone or in combination with one or more of the first through fourth aspects, the one or more gaps are used to prevent a corresponding one or more bits from being mapped to a layer, of the first layer or the second layer, that has a lower modulation order of the first modulation order or the second modulation order.

In a sixth aspect, alone or in combination with one or more of the first through fifth aspects, the one or more gaps are indicated by a transmitter.

In a seventh aspect, alone or in combination with one or more of the first through sixth aspects, the first modulation order and the second modulation order are indicated by a transmitter.

In an eighth aspect, alone or in combination with one or more of the first through seventh aspects, the bits are de-interleaved based at least in part on first channel information associated with the first layer and second channel information associated with the second layer.

In a ninth aspect, alone or in combination with one or more of the first through eighth aspects, the first channel information and the second channel information are different.

In a tenth aspect, alone or in combination with one or more of the first through ninth aspects, the first channel information includes a first signal to interference plus noise ratio (SINR) value and the second channel information includes a second SINR value.

In an eleventh aspect, alone or in combination with one or more of the first through tenth aspects, the first channel information and the second channel information are determined based at least in part on: sounding reference signals, channel state information, or a combination thereof.

In a twelfth aspect, alone or in combination with one or more of the first through eleventh aspects, the first channel information and the second channel information are determined for a sub-band in which the communication is to be transmitted.

In a thirteenth aspect, alone or in combination with one or more of the first through twelfth aspects, at least one of the first channel information or the second channel information is different for different sub-bands.

In a fourteenth aspect, alone or in combination with one or more of the first through thirteenth aspects, at least one of the first modulation order or the second modulation order is different for different sub-bands.

In a fifteenth aspect, alone or in combination with one or more of the first through fourteenth aspects, the bits are de-interleaved based at least in part on a first reliability associated with the first layer and a second reliability associated with the second layer.

In a sixteenth aspect, alone or in combination with one or more of the first through fifteenth aspects, the first reliability and the second reliability are determined based at least in part on: the first modulation order and the second modulation order, first channel information associated with the first layer and second channel information associated with the second layer, or a combination thereof.

In a seventeenth aspect, alone or in combination with one or more of the first through sixteenth aspects, the first reliability and the second reliability are determined for a sub-band in which the communication is to be transmitted.

In an eighteenth aspect, alone or in combination with one or more of the first through seventeenth aspects, de-interleaving the bits comprises: obtaining one or more systematic bits of the communication from one or more most significant bits of a set of modulated symbols associated with the first layer, wherein the first layer has a first reliability that is greater than a second reliability of the second layer; and refraining from obtaining any systematic bits of the communication from modulated symbols associated with the second layer.

In a nineteenth aspect, alone or in combination with one or more of the first through eighteenth aspects, de-interleaving the bits comprises: obtaining a first number of systematic bits of the communication from a corresponding first number of most significant bits of a set of modulated symbols associated with the first layer; and obtaining a second number of systematic bits of the communication from a corresponding second number of most significant bits of a set of modulated symbols associated with the second layer, wherein the first number and the second number are different.

In a twentieth aspect, alone or in combination with one or more of the first through nineteenth aspects, at least one of the first number or the second number depends on a sub-band in which the communication is to be transmitted.

In a twenty-first aspect, alone or in combination with one or more of the first through twentieth aspects, an interleaving behavior, to be used for the de interleaving, is indicated to the receiver.

In a twenty-second aspect, alone or in combination with one or more of the first through twenty-first aspects, the interleaving behavior indicates a pattern associated with obtaining coded bits from modulated symbol bits of at least one of the first layer or the second layer.

In a twenty-third aspect, alone or in combination with one or more of the first through twenty-second aspects, the interleaving behavior is indicated in downlink control information.

Although FIG. 13 shows example blocks of process 1300, in some aspects, process 1300 may include additional blocks, fewer blocks, different blocks, or differently arranged blocks than those depicted in FIG. 13. Additionally, or alternatively, two or more of the blocks of process 1300 may be performed in parallel.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a transmitter, comprising:
   determining a first modulation order for a first layer of a communication and a second modulation order for a second layer of the communication, wherein the first modulation order and the second modulation order are different;
   interleaving, according to a systematic bit priority mapping (SBPM) interleaving that is based at least in part on the first modulation order and the second modulation order, bits for one or more of the first layer or the second layer; and
   transmitting the interleaved bits via the one or more of the first layer or the second layer.

2. The method of claim 1, wherein interleaving the bits comprises mapping systematic bits of the communication to one or more most significant bits of each modulated symbol of a set of modulated symbols associated with the communication.

3. The method of claim 2, wherein the set of modulated symbols includes a first subset of modulated symbols associated with the first layer and a second subset of modulated symbols associated with the second layer; and
   wherein mapping the systematic bits comprises at least one of:
      mapping first systematic bits to the first subset of modulated symbols, mapping second systematic bits to the second subset of modulated symbols, or a combination thereof.

4. The method of claim 1, wherein the bits are interleaved based at least in part on one or more gaps where a bit is not mapped to a modulated symbol, wherein the one or more gaps are used to prevent a corresponding one or more bits from being mapped to a layer, of the first layer or the second layer, that has a lower modulation order of the first modulation order or the second modulation order.

5. The method claim 1, wherein at least one of the first modulation order and the second modulation order, an interleaving behavior to be used for performing de-interleaving, or one or more gaps where a bit is not mapped to a modulated symbol, are indicated to a receiver.

6. The method of claim 1, wherein the bits are interleaved based at least in part on first channel information associated with the first layer and second channel information associated with the second layer.

7. The method of claim 6, wherein the first channel information includes a first signal to interference plus noise ratio (SINR) value and the second channel information includes a second SINR value.

8. The method of claim 6, wherein the first channel information and the second channel information are determined based at least in part on:
   a sub-band in which the communication is to be transmitted,
   sounding reference signals,
   channel state information, or
   a combination thereof.

9. The method of claim 1, wherein at least one of the first modulation order or the second modulation order is different for different sub-bands.

10. The method of claim 1, wherein the bits are interleaved based at least in part on a first reliability associated with the first layer and a second reliability associated with the second layer.

11. The method of claim 10, wherein the first reliability and the second reliability are determined based at least in part on:
- a sub-band in which the communication is to be transmitted,
- the first modulation order and the second modulation order,
- first channel information associated with the first layer and second channel information associated with the second layer, or
- a combination thereof.

12. The method of claim 1, wherein interleaving the bits comprises:
- mapping one or more systematic bits of the communication to one or more most significant bits of a set of modulated symbols associated with the first layer, wherein the first layer has a first reliability that is greater than a second reliability of the second layer; and
- refraining from mapping any systematic bits of the communication to modulated symbols associated with the second layer.

13. The method of claim 1, wherein interleaving the bits comprises:
- mapping a first number of systematic bits of the communication to a corresponding first number of most significant bits of a set of modulated symbols associated with the first layer; and
- mapping a second number of systematic bits of the communication to a corresponding second number of most significant bits of a set of modulated symbols associated with the second layer, wherein the first number and the second number are different.

14. The method of claim 13, wherein at least one of the first number or the second number depends on a sub-band in which the communication is to be transmitted.

15. A method of wireless communication performed by a receiver, comprising:
- receiving interleaved bits via a first layer of a communication and a second layer of the communication;
- determining a first modulation order for the first layer and a second modulation order for the second layer, wherein the first modulation order and the second modulation order are different; and
- de-interleaving, according to a systematic bit priority mapping (SBPM) interleaving that is based at least in part on the first modulation order and the second modulation order, the interleaved bits based at least in part on the first modulation order and the second modulation order.

16. The method of claim 15, wherein de-interleaving the bits comprises obtaining systematic bits of the communication from one or more most significant bits of a set of modulated symbols associated with the communication.

17. The method of claim 16, wherein the set of modulated symbols includes a first subset of modulated symbols associated with the first layer and a second subset of modulated symbols associated with the second layer; and
wherein obtaining the systematic bits comprises at least one of:
- obtaining first systematic bits from the first subset of modulated symbols,
- obtaining second systematic bits from the second subset of modulated symbols, or
- a combination thereof.

18. The method of claim 15, wherein the bits are de-interleaved based at least in part on one or more gaps where a bit is not mapped to a modulated symbol, wherein the one or more gaps are used to prevent a corresponding one or more bits from being mapped to a layer, of the first layer or the second layer, that has a lower modulation order of the first modulation order or the second modulation order.

19. The method of claim 15, wherein at least one of the first modulation order and the second modulation order, an interleaving behavior to be used for performing de-interleaving, or one or more gaps where a bit is not mapped to a modulated symbol, are indicated by a transmitter.

20. The method of claim 15, wherein the bits are de-interleaved based at least in part on first channel information associated with the first layer and second channel information associated with the second layer.

21. The method of claim 20, wherein the first channel information includes a first signal to interference plus noise ratio (SINR) value and the second channel information includes a second SINR value.

22. The method of claim 20, wherein the first channel information and the second channel information are determined based at least in part on:
- a sub-band in which the communication is to be transmitted,
- sounding reference signals,
- channel state information, or
- a combination thereof.

23. The method of claim 15, wherein at least one of the first modulation order or the second modulation order is different for different sub-bands.

24. The method of claim 15, wherein the bits are de-interleaved based at least in part on a first reliability associated with the first layer and a second reliability associated with the second layer.

25. The method of claim 24, wherein the first reliability and the second reliability are determined based at least in part on:
- a sub-band in which the communication is to be transmitted,
- the first modulation order and the second modulation order,
- first channel information associated with the first layer and second channel information associated with the second layer, or
- a combination thereof.

26. The method of claim 15, wherein de-interleaving the bits comprises:
- obtaining one or more systematic bits of the communication from one or more most significant bits of a set of modulated symbols associated with the first layer, wherein the first layer has a first reliability that is greater than a second reliability of the second layer; and
- refraining from obtaining any systematic bits of the communication from modulated symbols associated with the second layer.

27. The method of claim 15, wherein de-interleaving the bits comprises:
- obtaining a first number of systematic bits of the communication from a corresponding first number of most significant bits of a set of modulated symbols associated with the first layer; and
- obtaining a second number of systematic bits of the communication from a corresponding second number of most significant bits of a set of modulated symbols associated with the second layer, wherein the first number and the second number are different.

28. The method of claim 27, wherein at least one of the first number or the second number depends on a sub-band in which the communication is to be transmitted.

29. A transmitter for wireless communication, comprising:
- a memory; and
- one or more processors coupled to the memory, the one or more processors configured to:
  - determine a first modulation order for a first layer of a communication and a second modulation order for a second layer of the communication, wherein the first modulation order and the second modulation order are different;
  - interleave, according to a systematic bit priority mapping (SBPM) interleaving that is based at least in part on the first modulation order and the second modulation order, bits for one or more of the first layer or the second layer based at least in part on the first modulation order and the second modulation order; and
  - transmit the interleaved bits via the one or more of the first layer or the second layer.

30. A receiver for wireless communication, comprising:
- a memory; and
- one or more processors coupled to the memory, the one or more processors configured to:
  - receive interleaved bits via a first layer of a communication and a second layer of the communication;
  - determine a first modulation order for the first layer and a second modulation order for the second layer, wherein the first modulation order and the second modulation order are different; and
  - de-interleave, according to a systematic bit priority mapping (SBPM) interleaving that is based at least in part on the first modulation order and the second modulation order, the interleaved bits based at least in part on the first modulation order and the second modulation order.

* * * * *